United States Patent
Shiang-Chich

(10) Patent No.: US 7,040,384 B2
(45) Date of Patent: May 9, 2006

(54) HEAT DISSIPATION DEVICE

(75) Inventor: Tseng Shiang-Chich, BanChaiu (TW)

(73) Assignee: Molex Incorporated, Lisle, IL (US)

( * ) Notice: Subject to any disclaimer, the term of this patent is extended or adjusted under 35 U.S.C. 154(b) by 117 days.

(21) Appl. No.: 10/765,522

(22) Filed: Jan. 27, 2004

(65) Prior Publication Data

US 2005/0161201 A1    Jul. 28, 2005

(51) Int. Cl.
*F28F 7/00* (2006.01)
*H05K 7/20* (2006.01)

(52) U.S. Cl. ................. 165/122; 165/104.34; 165/80.3

(58) Field of Classification Search ............... 165/80.3, 165/185, 121, 122, 146, 147, 58; 361/695, 361/697, 709, 710; 257/719, 722, 721
See application file for complete search history.

(56) References Cited

U.S. PATENT DOCUMENTS

| | | | | |
|---|---|---|---|---|
| 4,953,634 A | * | 9/1990 | Nelson et al. | 165/147 |
| 5,810,072 A | * | 9/1998 | Rees et al. | 165/80.3 |
| 6,304,445 B1 | * | 10/2001 | Bollesen | 361/697 |
| 6,438,984 B1 | * | 8/2002 | Novotny et al. | 62/259.2 |
| 6,459,583 B1 | * | 10/2002 | Lo | 361/704 |
| 6,711,016 B1 | * | 3/2004 | Chung et al. | 361/695 |
| 2003/0155106 A1 | * | 8/2003 | Malone et al. | 165/121 |
| 2003/0202327 A1 | * | 10/2003 | Chung et al. | 361/697 |

FOREIGN PATENT DOCUMENTS

GB    2296132 A    *    6/1996

* cited by examiner

*Primary Examiner*—Tho Duong
(74) *Attorney, Agent, or Firm*—Robert J. Zeitler

(57) ABSTRACT

A heat dissipation device includes a heat sink, a fan adapter and a fan. The fan adapter has two opposing sidewalls straight arranged thereof, a top wall disposed horizontally and connecting the two sidewalls, an inlet formed in a front thereof, an oblique reduced cross-sectional area portion extending backwardly from a rear thereof, and an outlet formed in a rear of the oblique reduced cross-sectional area portion. The fan adapter encloses the heat sink; the fan disposes on the inlet of the fan adapter. Whereby heat around electrical components, on which the heat dissipation device is arranged, can be carried out by a fluid flows passing through the oblique reduced cross-sectional area portion.

7 Claims, 6 Drawing Sheets

HEAT DISSIPATION DEVICE

FIELD OF THE INVENTION

The present invention relates to a heat dissipation device, and particularly relates to a heat dissipation device adopted for heat dissipation of electrical components.

BACKGROUND OF THE INVENTION

As computer industry develops, electrical components arranged in CPU have smaller and smaller size and higher and higher heat. For keeping normal temperature, which the electrical components work, they provide a larger area heat dissipation device arranged on the electrical components for carrying out the heat and keeping general operation of the electrical components.

With respect to FIG. 1, a conventional heat dissipation device includes a heat sink 10, a fan 11 and a fan adapter 12. The heat sink 10 is made of aluminum or copper materials and has a plurality of fins 13 disposed thereon. The heat sink 10 disposes on the electrical components (not shown), and connects therewith by proper devices, the heat, which is generated from the electrical components, transmits to and dissipates out from the heat sink 10.

The fan 11 connects aside of the heat sink 10, the fan adapter 12 encloses the heat sink 10. The fan adapter 12 is in a U shape and has an inlet 14 and an outlet 15, are respectively formed at a rear and a front thereof. While the fan 11 operates to drive flows, the flows run from the inlet 14, pass through the fins 13 for heat dissipation, and exhaust out of the outlet 15 by carrying the heat.

However, the outlet 14 has a cross-sectional area as same as that of the inlet 15, amount of flows through the inlet 15 equals to that of the outlet 14, and the heat remains around the outlet 14 but not dissipates away to affect the electrical components arranged therein.

Hence, the prior art improved is required to overcome the disadvantages thereof.

SUMMARY OF THE INVENTION

An object of the invention is therefore to specify a heat dissipation device including a fan adapter with an oblique reduced cross-sectional area portion to increase powerfully exhaustion flows and to generate turbulent flows, so that the heat will not remain around an outlet thereof and electrical components arranged on the heat dissipation device will not be affected thereby.

Another object of the invention is therefore to specify a heat dissipation device including a fan adapter with an oblique reduced cross-sectional area portion to provide a space formed under the oblique reduced cross-sectional area portion for arranging another electrical components different from the electrical components disposed on circuit boards.

An additional object of the invention is therefore to specify a heat dissipation device including a fin with a protruding portion extending a rear thereof for increasing dissipating area thereof and improving dissipating effects.

According to the invention, these objects are achieved by a heat dissipation device including a heat sink, a fan adapter and a fan. The fan adapter has two opposing sidewalls straight arranged thereof, a top wall disposed horizontally and connecting the two sidewalls, an inlet formed in a front thereof, an oblique reduced cross-sectional area portion extending backwardly from a rear thereof, and an outlet formed in a rear of the oblique reduced cross-sectional area portion. The fan adapter encloses the heat sink; the fan disposes on the inlet of the fan adapter. Whereby heat around electrical components, on which the heat dissipation device is arranged, can be carried out by a fluid flows passing through the oblique reduced cross-sectional area portion.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention that will be described hereinafter and which will form the subject of the claims appended hereto.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE DISCLOSED EMBODIMENTS

Figure 1:
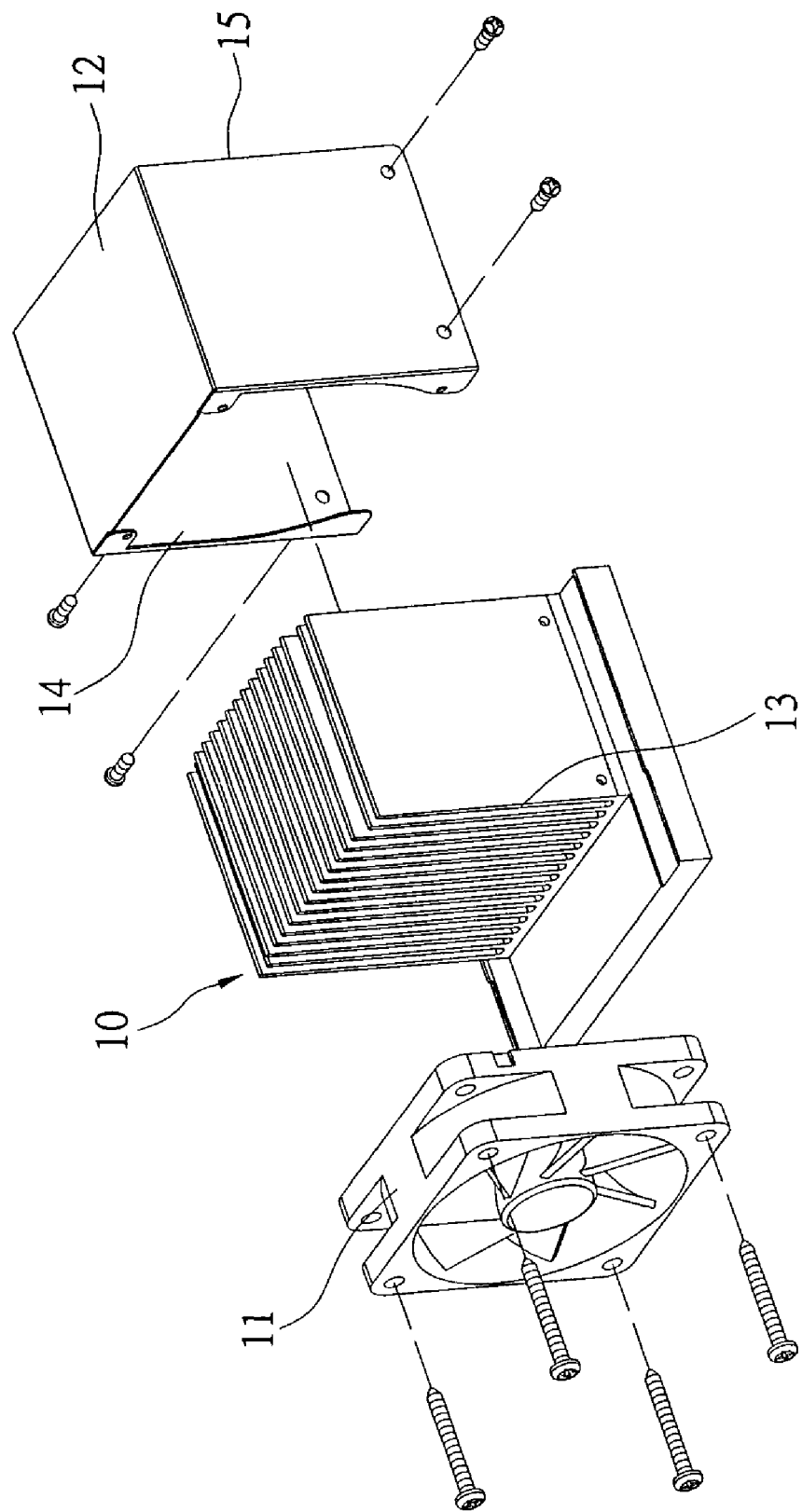
FIG. 1 is an exploded view according to a conventional heat dissipation device.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 2:
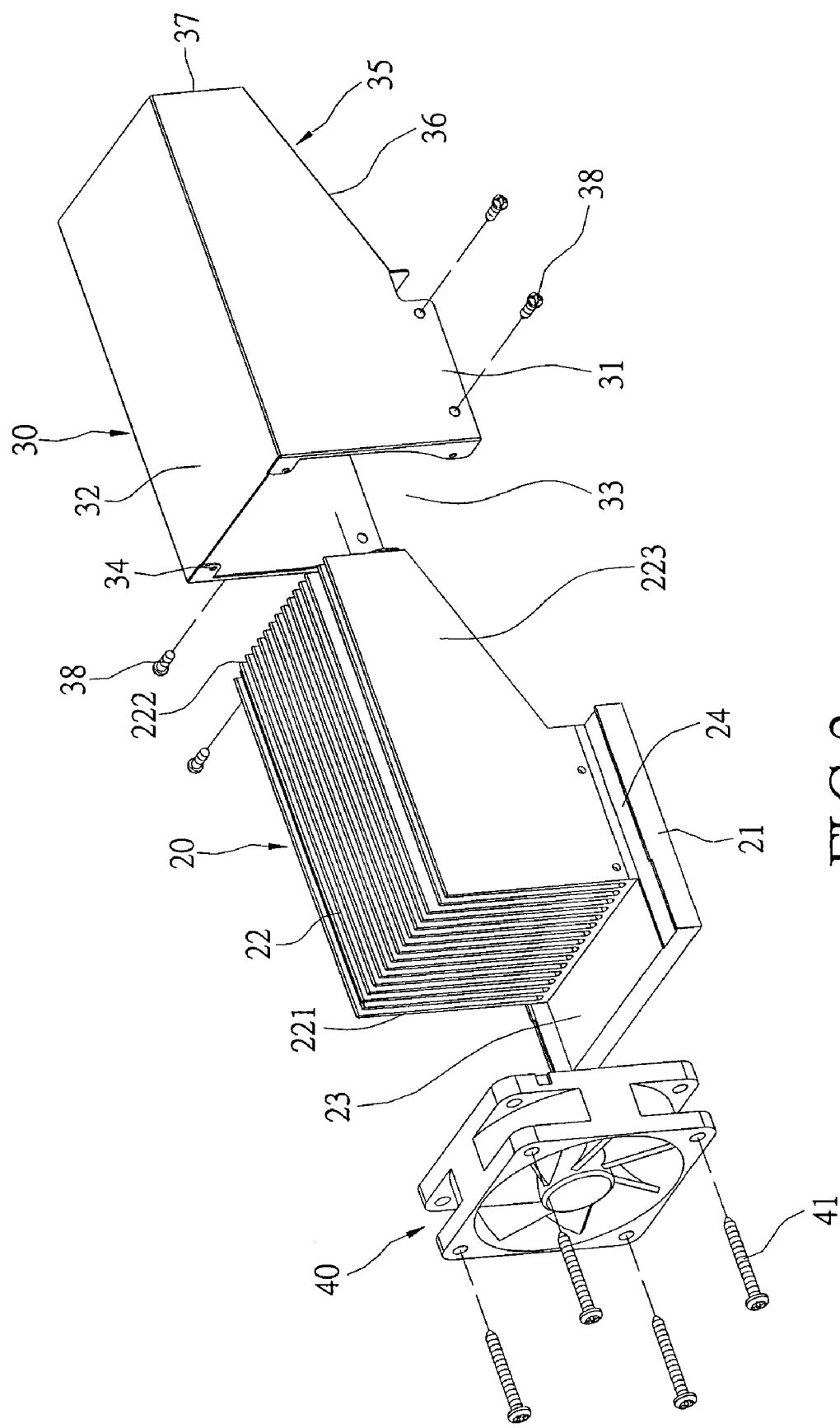
FIG. 2 is an exploded view of a heat dissipation device according to the present invention.
Figure 3:
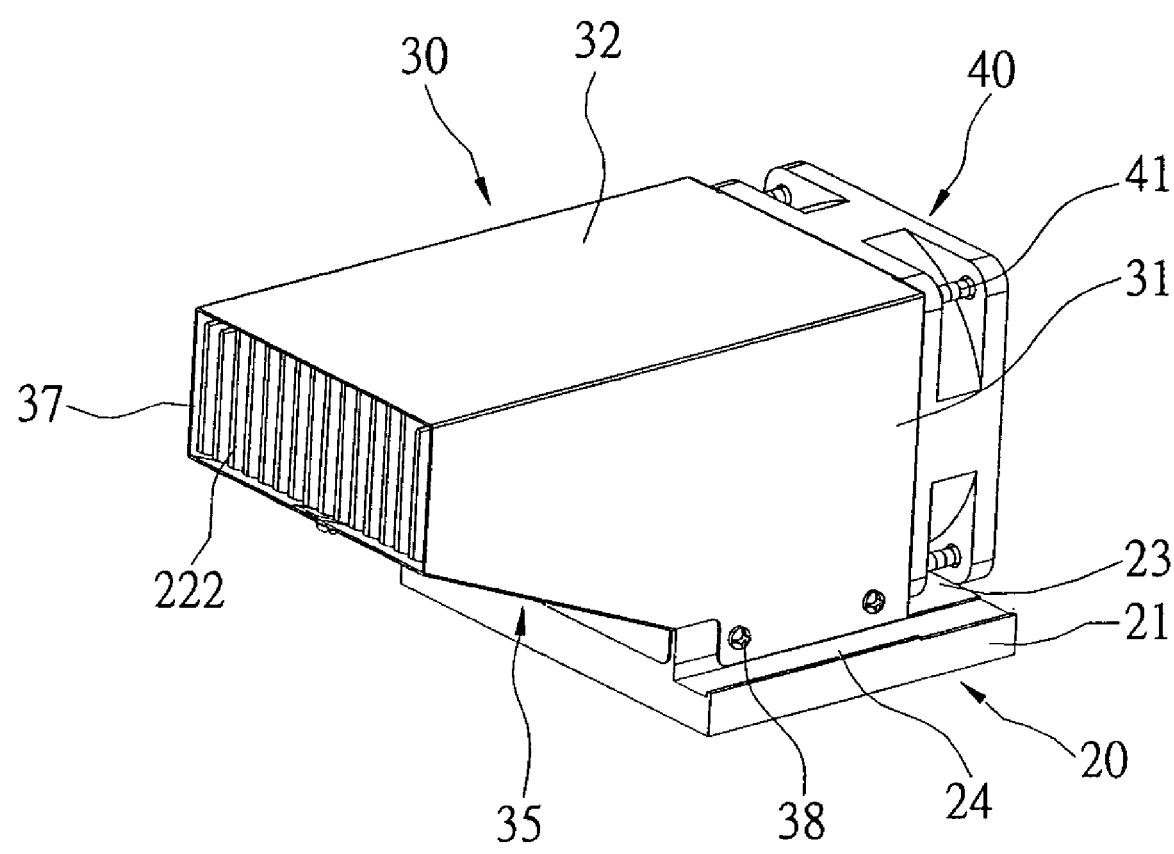
FIG. 3 is a perspective view of the heat dissipation device according to the present invention.
Figure 4:
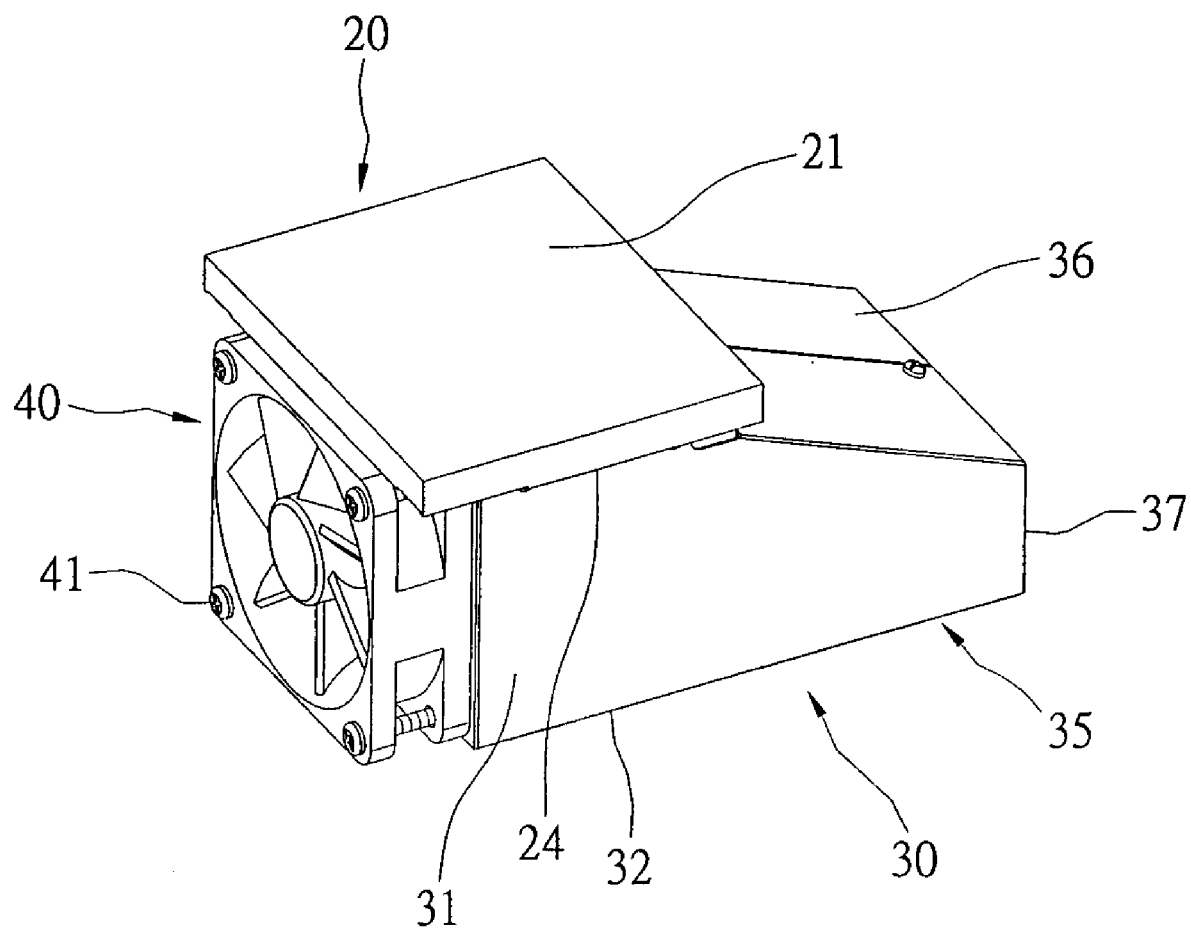
FIG. 4 is a perspective view from another angle of the heat dissipation device according to the present invention.

Referring to FIG. 2, FIG. 3 and FIG. 4, the present invention provides a heat dissipation device including a heat sink 20, a fan adapter 30 and a fan 40. The heat sink 20 is made of materials with high conductive, such as aluminum or copper. The heat sink 20 includes a base 21 and a plurality of fins 22 arranged on the base 21 integrally in one piece or in a detachable assembly manner. Type of the fins 22 will be not restricted and limited.

The heat dissipation device has an inlet 221 formed in a front thereof and an outlet 222 formed in a rear thereof, wherein the fins 22 dispose between the inlet 221 and the outlet 222. The inlet 221 has a proper distance from a front of the base 21 for proving a fan-supporting area 23. The fan 40 is disposed on the fan-supporting area 23. Each of the fins 22 has a rear aligns with a rear edge of the base 21 or has a protruding portion 223 extending backwardly from the rear thereof. According to this embodiment, each of the fins 22 includes the protruding portion 223 accommodated to the fan adapter 40 for increasing heat-dissipating area. The heat dissipation device has two proper distances formed on the base 21 respectively spaced from two lateral sides of the base 21 for providing a shoulder portion 24 arranged thereon.

The fan adapter 30 is made of metallic plate, and has two opposing sidewalls 31 straight arranged thereof, a top wall 32 disposed horizontally and connecting the two sidewalls 31 for providing a U-shaped like configuration thereof. The fan adapter 30 includes an inlet 33 formed at a front thereof and four orientation holes 34 arranged on four corners adjacent to the inlet 33 for securing the fan 40.

The fan adapter 30 extends a proper length backwardly from a rear thereof to be an oblique reduced cross-sectional area portion 35. The oblique reduced cross-sectional area portion 35 is a hollow tube with a top, a bottom and two sides. The oblique reduced cross-sectional area portion 35 has an inclined wall 36 on the bottom and an outlet 37 formed on a rear thereof, the outlet 37 has a cross-sectional area smaller than that of the inlet 33 thereby and the oblique reduced cross-sectional area portion 35 further has a space formed under the inclined wall 36 and adopted for receiving another electrical components different from those disposed on circuit boards. The fan adapter 30 encloses the heat sink 20, and the inlet 33 and the outlet 37 of the fan adapter 30 respectively corresponds the inlet 221 and the outlet 222 of the heat sink 20. The protruding portion 223 corresponds in the oblique reduced cross-sectional area portion 35; the present invention further provides a plurality of screws 38 penetrating through the fan adapter 30 and secured the fan adapter 30 to the heat sink 20. As can be seen in FIG. 3, the shape of the fins 22 preferably conform to the shape of the fan adaptor 30 such that the outlet portion 222 of the fins 22 extend to the outlet 37 of the fan adaptor 30.

The fan 40 disposes on the fan-supporting area 23 of the heat sink 20. The fan 40 connects the inlet 221 of the heat sink 20 and the inlet 33 of the fan adapter 30 with fours screws 41 secured on four corners thereof.

Figure 5:
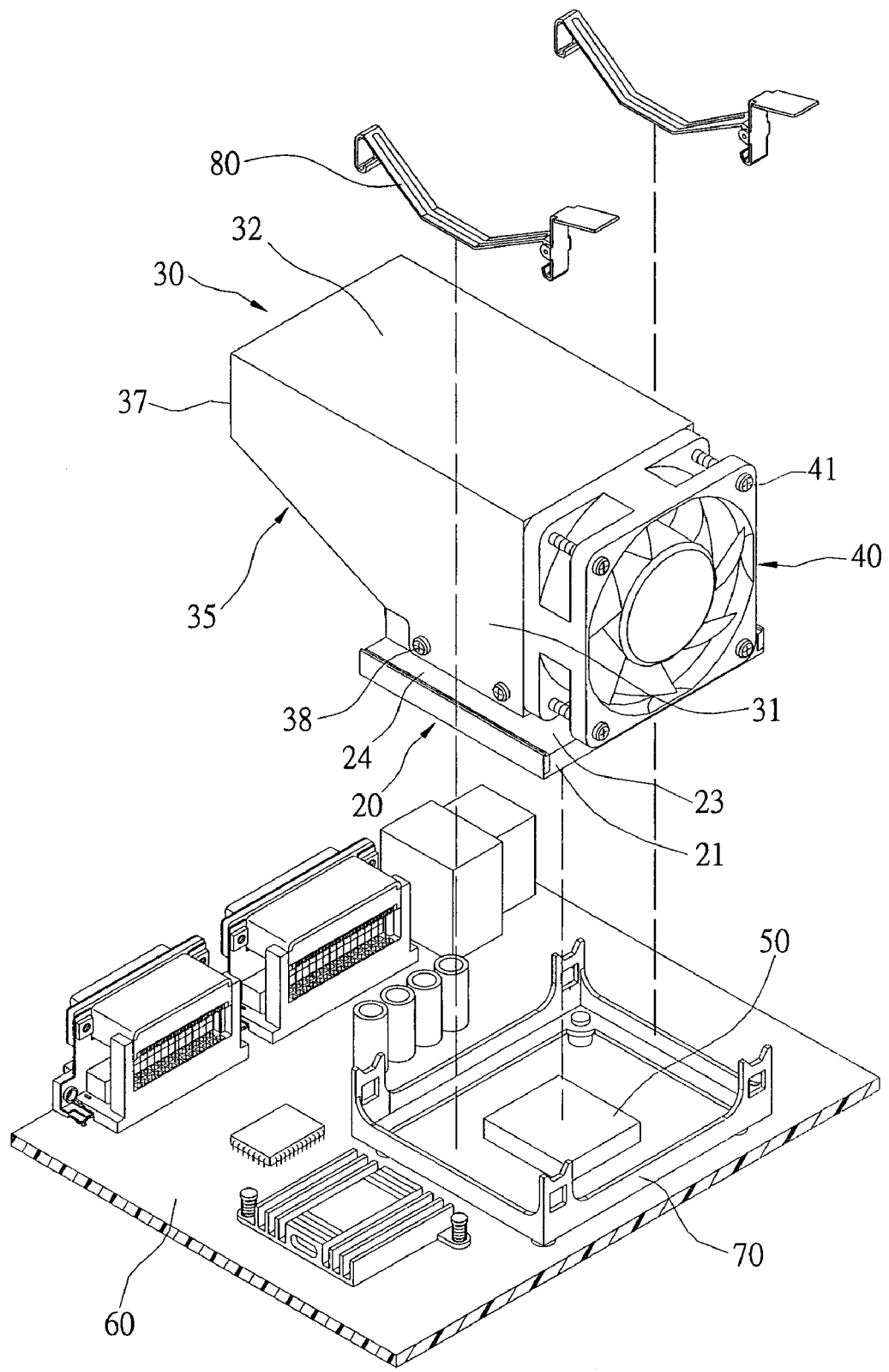
FIG. 5 is an exploded view of the heat dissipation device, electrical components, a seat and a buckling device according to the present invention.
Figure 6:
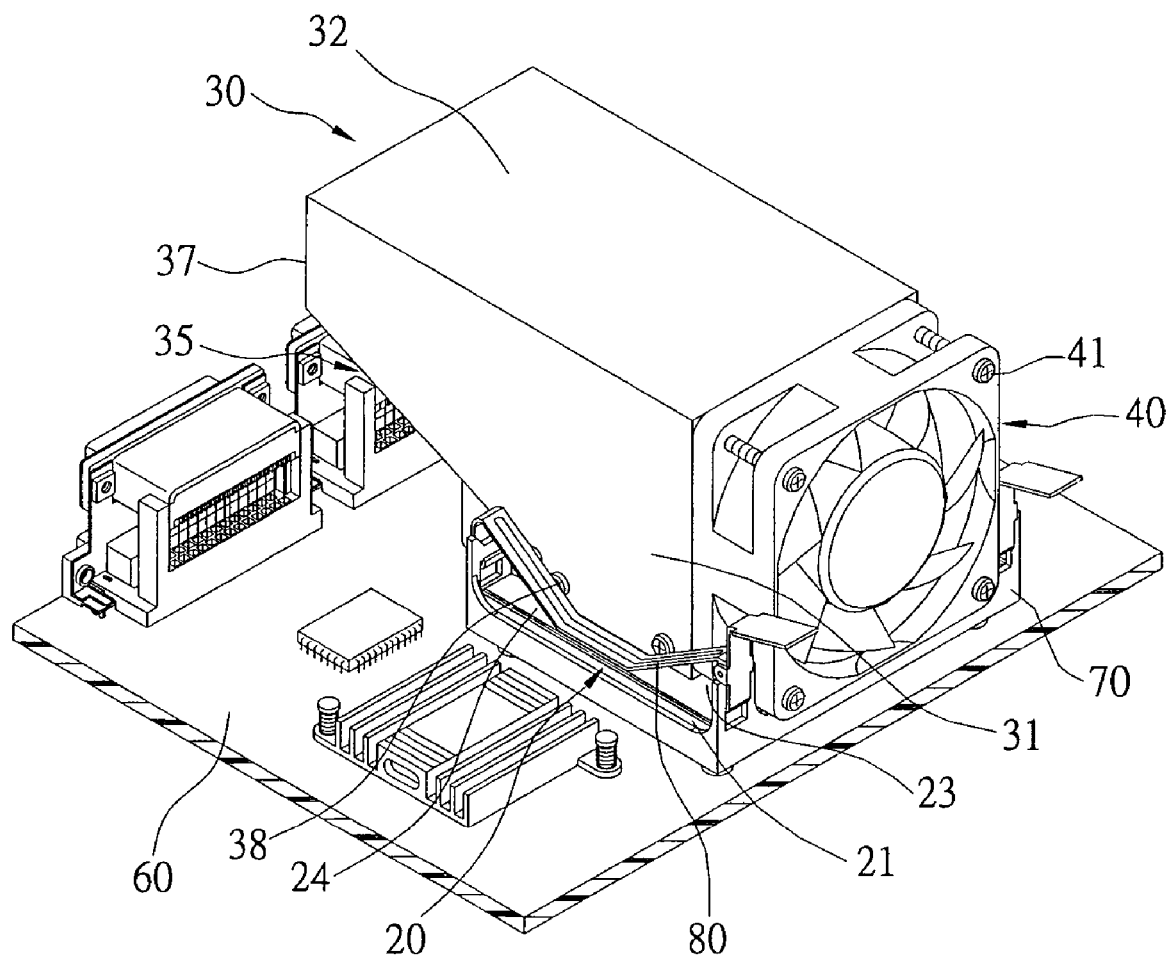
FIG. 6 is a perspective view of the heat dissipation device, the electrical components, the seat and the buckling device according to the present invention.

Referring to FIG. 5 and FIG. 6, the present invention provides heat dissipation from electrical components 50, which arrange on the heat dissipation device. A bottom of the base 21 contacts with tops of the electrical components 50, so that the heat transmits to the heat sink 20 via electrical components 50.

The electrical components 50 dispose on a circuit board 60. The circuit board 60 includes a seat 70 arranged thereon and around the electrical components 50. The present invention further provides two buckling devices 80 securing two opposing sides of the seat 70, and the two buckling devices 80 resiliently pressing the two shoulder portions 24 for the bottom of the heat sink 20 tightly contacting with the tops of the electrical components 50.

While the fan 40 generates and drives air flowing therein, cool air runs in from the inlet 33 of the fan adapter 30, passes through the fins 22 of the heat sink 20, which provides most heat dissipation, exhausts out of the outlet 37 of the fan adapter 30 and to be hot air.

Because of the oblique reduced cross-sectional area portion 35, the outlet 37 of the fan adapter 30 has a cross-sectional area smaller than that of the inlet 33 thereof to generate turbulent flows around the outlet 37 thereof, so as to the heat can be carried out by strongly flows and not remains still to affect electrical components 50 any more.

Furthermore, the space formed under the oblique reduced cross-sectional area portion 35 can be used to house other electrical components 50 on the surface upon which the heat dissipating device is mounted, thereby allowing for space savings. And the protruding portion 223 of each of the fins 22 can increase heat-dissipation area efficiently and get an improved efficiency.

While a preferred embodiment of the present invention is shown and described, it is envisioned that those skilled in the art may devise various modifications of the present invention without departing from the spirit and scope of the appended claims.

What is claimed is:

1. A heat dissipation device adopted for heat dissipation of heat generating electrical components, comprising:
   a heat sink capable of being disposed on the electrical components;
   a fan adapter including two opposing sidewalls straight arranged thereof, a top wall disposed horizontally and connecting the two sidewalls, an inlet formed in a front thereof, an oblique reduced cross-sectional area portion extending backwardly from a rear thereof, and an outlet formed in a rear of the oblique reduced cross-sectional area portion, wherein the oblique reduced cross-sectional area portion has an inclined wall on the bottom and a space formed thereunder to allow the area under the inclined wall to be used to receive electrical components thereunder and wherein the fan adapter encloses the heat sink; and
   a fan located at the inlet of the fan adapter.

2. The heat dissipation device claimed as claim 1, wherein the heat sink has a base and a plurality of fins arranged on the base.

3. The heat dissipation device claimed as claim 2, wherein the heat sink has an inlet formed in a front thereof and a outlet formed in a rear thereof, the fins arranged between the inlet and the outlet of the heat sink, the inlet has a proper distance from a front of the base for proving a fan-supporting area, on which the fan disposes.

4. The heat dissipation device claimed as claim 2, wherein the each of the fins has a protruding portion extending backwardly from a rear thereof for accommodating the fan adapter and corresponding to the oblique reduced cross-sectional area portion.

5. The heat dissipation device claimed as claim 1, wherein the heat sink has two proper distances formed on the base respectively spaced from two lateral sides of the base for providing a shoulder portion arranged thereon; the electrical components dispose on a circuit board; the circuit board includes a seat arranged thereon and around the electrical components, and two buckling devices securing two opposing sides of the seat; the two buckling devices resiliently pressing the two shoulder portions respectively for a bottom of the heat sink tightly contacting with tops of the electrical components.

6. The heat dissipation device claimed as claim 1, wherein the fan adapter includes four orientation holes arranged on four corners adjacent to the inlet for securing the fan to the fan adapter.

7. The heat dissipation device claimed as claim 1, wherein the fan adapter is screwed to secure to the heat sink.

* * * * *